(12) United States Patent
Suzuki et al.

(10) Patent No.: US 7,608,680 B2
(45) Date of Patent: Oct. 27, 2009

(54) TRIARYLAMINE POLYMER, PROCESS FOR PRODUCING THE SAME, AND USE THEREOF

(75) Inventors: Takao Suzuki, Yamaguchi (JP); Masakazu Nishiyama, Yamaguchi (JP); Hisao Eguchi, Yamaguchi (JP)

(73) Assignee: Tosoh Corporation, Shunan-shi (JP)

( * ) Notice: Subject to any disclaimer, the term of this patent is extended or adjusted under 35 U.S.C. 154(b) by 198 days.

(21) Appl. No.: 11/476,669

(22) Filed: Jun. 29, 2006

(65) Prior Publication Data

US 2006/0241278 A1 Oct. 26, 2006

Related U.S. Application Data

(62) Division of application No. 10/490,741, filed as application No. PCT/JP03/10074 on Aug. 7, 2003, now abandoned.

(30) Foreign Application Priority Data

Aug. 9, 2002 (JP) ............................... 2002-233007
Feb. 6, 2003 (JP) ............................... 2003-029977

(51) Int. Cl.
C08G 73/00 (2006.01)
C08G 73/02 (2006.01)
C07C 211/57 (2006.01)
C07C 211/55 (2006.01)
C07C 211/54 (2006.01)

(52) U.S. Cl. ...................... 528/397; 528/422; 313/504; 313/506; 564/308; 564/309; 564/427; 564/434

(58) Field of Classification Search ........................ None
See application file for complete search history.

(56) References Cited

U.S. PATENT DOCUMENTS

| 5,728,801 | A | 3/1998 | Wu et al. | |
| 6,034,206 | A | 3/2000 | Yamamoto et al. | |
| 6,084,176 | A | 7/2000 | Shiratsuchi et al. | |
| 6,630,566 | B1 | 10/2003 | Allen et al. | |
| 2003/0129449 | A1* | 7/2003 | Parton et al. | 428/690 |
| 2005/0067951 | A1* | 3/2005 | Richter et al. | 313/504 |

FOREIGN PATENT DOCUMENTS

| DE | 101 09 463 A1 | 10/2002 |
| EP | 0 372 979 | 6/1990 |
| JP | 3-273087 | 12/1991 |
| JP | 8-54833 | 2/1996 |
| JP | 8-100038 | 4/1996 |
| JP | 8-259935 | 10/1996 |
| JP | 10-308280 | 11/1998 |
| JP | 11-21349 | 1/1999 |
| JP | 11-35687 | 2/1999 |
| JP | 11-80346 | 3/1999 |
| JP | 11-80347 | 3/1999 |
| JP | 11-80348 | 3/1999 |
| JP | 11-80349 | 3/1999 |
| JP | 11154594 | * 6/1999 |
| JP | 11-292829 | 10/1999 |
| JP | 2001-98023 | 4/2001 |
| JP | 2001-223084 | 8/2001 |
| JP | 2002-80595 | 3/2002 |
| JP | 2002-128891 | 5/2002 |
| TW | 2003-02263 | * 8/2003 |

OTHER PUBLICATIONS

Machine translation of JP11021349 No date.*
Tokito et al, "Thermal Stability in Oligomeric Triphenylamine/tris(8-quinolinolato) Aluminum Electroluminescent Devices", Applied Physics Letters 70(15) Apr. 1997 pp. 1929-1931.
esp@cenet—English abstract of DE10109463.
esp@cenet—English abstract of JP8100038.
esp@cenet—English abstract of JP10308280.
esp@cenet—English abstract of JP11021349.
esp@cenet—English abstract of JP3273087.
esp@cenet—English abstract of JP8054833.
esp@cenet—English abstract of JP8259935.
esp@cenet—English abstract of JP11035687.
esp@cenet—English abstract of JP11292829.
esp@cenet—English abstract of JP2001098023.

(Continued)

*Primary Examiner*—David Buttner
(74) *Attorney, Agent, or Firm*—Oblon, Spivak, McClelland, Maier & Neustadt, L.L.P.

(57) ABSTRACT

It is an object of the present invention to provide a novel triarylamine polymer which is excellent in solubility and film-forming property and has improved thermal stability; a simple process for its production; and an electronic element employing it.

A triarylamine polymer represented by the following formula (1) (wherein each of $Ar^1$, $Ar^2$, $Ar^3$, $Ar^4$, $Ar^5$, $Ar^6$ and $Ar^7$ which are independent of one another, is an unsubstituted or substituted $C_{6-60}$ aromatic group, $Ar^1$ and $Ar^2$ are the same or different, $Ar^3$ and $Ar^4$ are the same or different, and m is an integer of at least 1), a process for its production, and an electronic element employing it, are provided:

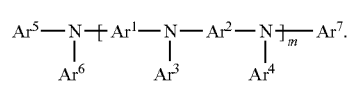

(1)

10 Claims, 2 Drawing Sheets

OTHER PUBLICATIONS esp@cenet—English abstract of JP11080346.
esp@cenet—English abstract of JP11080347.
esp@cenet—English abstract of JP11080348.
esp@cenet—English abstract of JP11080349.
esp@cenet—English abstract of JP2002080595.
esp@cenet—English abstract of JP2002128891.
esp@cenet—English abstract of JP2001223084.

* cited by examiner

TRIARYLAMINE POLYMER, PROCESS FOR PRODUCING THE SAME, AND USE THEREOF

TECHNICAL FIELD

The present invention relates to a novel triarylamine polymer, a process for its production and an organic electroluminescence (EL) element employing it.

BACKGROUND ART

Materials for an organic EL element may be divided into a light emitting layer as the main component, a carrier transport layer for transporting holes or electrons, two electrodes i.e. a cathode and an anode, and other materials.

As materials for an organic EL element, various low molecular materials and high molecular materials are employed for such a light emitting layer or a carrier transport layer. Especially with respect to low molecular materials, many materials have been proposed.

On the other hand, also with respect to high molecular materials, electroconductive π conjugated polymers such as poly(p-phenylenevinylene), polyalkylthiophene, etc. are, for example, known (e.g. Patent Document 1), and in recent years, polymers containing triarylamines have been reported (e.g. Patent Documents 2 to 6).

And, also the present inventors have developed an efficient synthetic process for a novel triarylamine polymer containing a triarylamine in its main chain and have already filed Patent Applications (e.g. JP-A-3-273087, JP-A-08-054833, JP-A-08-259935, JP-A-11-035687, JP-A-11-292829, JP-A-13-098023, JP-A-11-021349, JP-A-11-080346, JP-A-11-080347, JP-A-11-080348 and JP-A-11-080349).

However, to use as organic EL materials, such polymers have been found to be not necessarily satisfactory, since the thermal stability of terminal moieties is low, and they have a problem in useful life.

The present invention has been made in view of the above problems, and its object is to provide a novel triarylamine polymer which is excellent in solubility and film-forming property and has improved thermal stability; a simple process for its production; and an organic EL element employing it.

DISCLOSURE OF THE INVENTION

The present inventors have conducted various studies to solve the above problems and as a result, have found a triarylamine polymer of the present invention, a process for its production and its use, whereby the present invention have been accomplished.

Namely, the present invention provides a novel triarylamine polymer represented by the following formula (1):

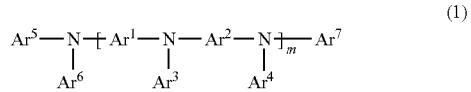

(wherein each of $Ar^1$, $Ar^2$, $Ar^3$, $Ar^4$, $Ar^5$, $Ar^6$ and $Ar^7$ which are independent of one another, is an unsubstituted or substituted $C_{6-60}$ aromatic group, $Ar^1$ and $Ar^2$ are the same or different, $Ar^3$ and $Ar^4$ are the same or different, and m is an integer of at least 1); a process for its production; and its use.

In the above formula (1), substituent $Ar^3$ and $Ar^4$ are preferably the same. Further, a case wherein $Ar^1$ and $Ar^2$ are the same, may be represented by the following formula (2):

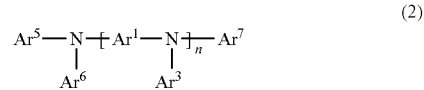

(wherein each of $Ar^1$, $Ar^3$, $Ar^5$, $Ar^6$ and $Ar^7$ which are independent of one another, is an unsubstituted or substituted $C_{6-60}$ aromatic group, and n is an integer of at least 2.)

Further, in the above formula (2), it is preferred that $Ar^5$ and $Ar^7$ are the same, and $Ar^3$ and $Ar^6$ are the same.

In the compounds represented by the above formulae (1) and (2), substituents $Ar^5$, $Ar^6$ and $Ar^7$ represent an unsubstituted or substituted $C_{6-60}$ aromatic group, preferably a $C_{6-30}$ aromatic group. The aromatic group may, for example, be an unsubstituted or substituted phenyl, naphthyl, anthracenyl, phenanthryl, biphenyl, terphenyl or fluorenyl group, but a structure represented by the following formula (3) is preferred.

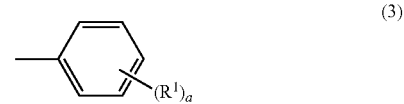

(wherein $R^1$ each independently is a hydrogen atom, a halogen atom, an alkyl group, an alkoxy group, an alkenyl group, an aryl group, an arylamino group or a heteroaryl group, $R^1$ may form a condensed ring together with other substituent(s), and a is an integer of from 0 to 5.)

In the above formula (3), substituent $R^1$ is not particularly limited so long as it corresponds to the above definition. Specifically, it includes, in addition to a hydrogen atom, a halogen atom (such as a fluorine atom, a chlorine atom or a bromine atom), an alkyl group (such as a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a cyclopentyl group, a n-hexyl group, a 2-ethylbutyl group, a 3,3-dimethylbutyl group, a cyclohexyl group, a n-heptyl group, a cyclohexylmethyl group, a n-octyl group, a tert-octyl group, a 2-ethylhexyl group, a n-nonyl group, a n-decyl group or a trifluoromethyl group), an alkoxy group (such as a methoxy group, an ethoxy group, a n-propoxy group, an isopropoxy group, a n-butoxy group, a sec-butoxy group, a n-pentyloxy group, an isopentyloxy group, a neopentyloxy group, a cyclopentyloxy group, a n-hexyloxy group, a 2-ethylbutoxy group, a 3,3-dimethylbutoxy group, a cyclohexyloxy group, a n-heptyloxy group, a cyclohexylmethyloxy group, a n-octyloxy group, a 2-ethylhexyloxy group, a n-nonyloxy group, a n-decyloxy group or a trifluoromethoxy group), an alkenyl group (such as an ethenyl group, a 2-propenyl group, a 1-methylethenyl group, a 3-butenyl group, a 1-methyl-2-propenyl group, or a 4-pentenyl group), an aryl group (such as a phenyl group, a 2-methoxyphenyl group, a 3-methoxyphenyl group, a 4-methoxyphenyl group, a 2-methylphenyl group, a 3-methylphenyl group, a 4-methylphenyl group, a 2-hydroxyphenyl group, a 3-hydroxyphenyl group, a 4-hydroxyphenyl group, a 2-trifluoromethylphenyl group, a 3-trifluoromethylphenyl group, a 4-trifluoromethylphenyl group, a 2,6-dimethylphenyl group, a 3,6-dimethylphenyl group, a 2,3-dimethylphenyl group, a 3,4-dimethylphenyl group, a 2,4-dimethylphenyl group, a 3,5-dimethylphenyl group, a 3-(trifluoromethoxy)phenyl group, a 4-(trifluoromethoxy)phenyl group, a 3,4-(methylenedioxy)phenyl group, a 2-biphenyl group, a 3-biphenyl group, a 4-biphenyl group, a 4-terphenyl group, a 1-naphthyl group, a 2-naphthyl group, a 2-methylnaphthyl group, a 4-methylnaphthyl group, a 9-anthracenyl group or a 9,9-disubstituted 2-fluorenyl group), an arylamino group (such as a diphenylamino group, a di-p-tolylamino group, an N-phenyl-1-naphtylamino group or an N-phenyl-2-naphtylamino group) and a heteroaryl group (such as a 2-furyl group, a 2-thienyl group or a 2-pyridyl group). More preferred is a hydrogen atom, an alkyl group, an alkenyl group or an arylamino group.

In the above formulae (1) and (2), substituents $Ar^1$, $Ar^2$, $Ar^3$ and $Ar^4$ represent an unsubstituted or substituted $C_{6-60}$ aromatic group, preferably a $C_{6-30}$ aromatic group. The aromatic group is preferably an unsubstituted or substituted phenyl, phenyl, naphthyl, anthracenyl, phenanthryl, biphenyl, terphenyl or fluorenyl group.

In the above formulae (1) and (2), substituents $Ar^1$ and $Ar^2$ may, for example, have a structure represented by any one of the following formulae (4) to (8):

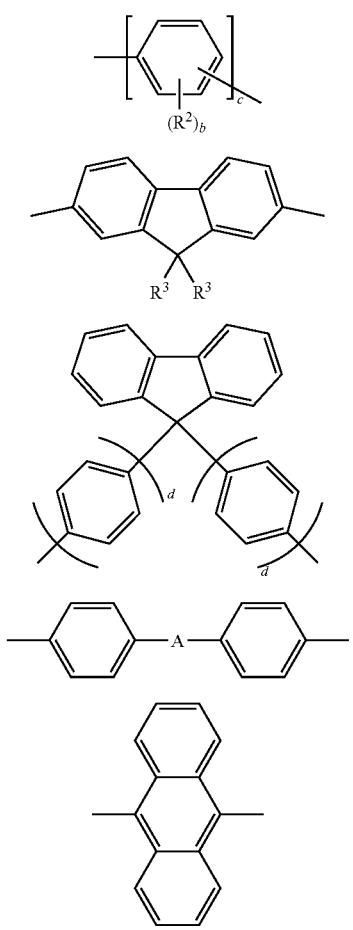

(wherein each of $R^2$ and $R^3$ which are independent of each other, is a hydrogen atom, a halogen atom, an alkyl group, an alkoxy group, an alkenyl group, an aryl group, an arylamino group or a heteroaryl group, $R^2$ may, together with other substituent(s), form a condensed ring, A is S, O, $SO_2$, CO, $CH_2$ or $C(CH_3)_2$, b is an integer of from 0 to 4, and each of c and d is an integer of from 1 to 4.)

In the above formula (4), structures of the following formulae (4-1) and (4-2) are more preferred.

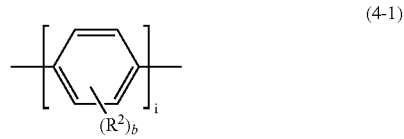

(wherein i is an integer of from 2 to 4.)

In the above formulae (4) and (5), substituents $R^2$ and $R^3$ are not particularly limited so long as they correspond to the above definition. Specifically, substituents mentioned for substituent $R^1$ may, for example, be mentioned.

Further, in the above formulae (1) and (2), substituents $Ar^3$ and $Ar^4$ may be those having structures represented by the following formulae (9) to (13).

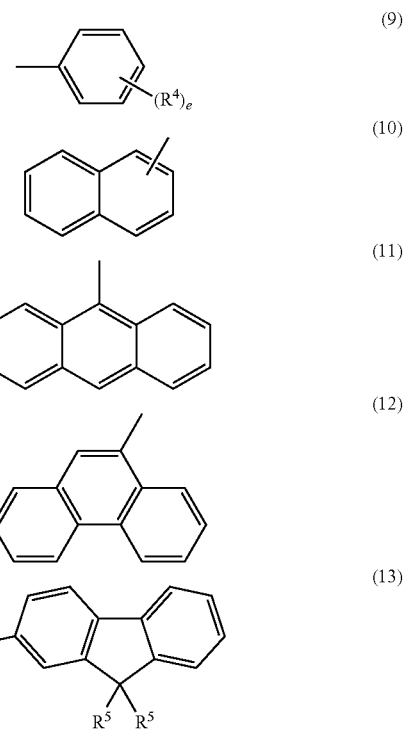

(wherein each of $R^4$ and $R^5$ which are independent of each other, is a hydrogen atom, a halogen atom, an alkyl group, an alkoxy group, an alkenyl group, an aryl group, an arylamino group or a heteroaryl group, $R^4$ may, together with other substituent(s), form a condensed ring, and e is an integer of from 0 to 5.)

In the above formulae (9) to (13), substituents $R^4$ and $R^5$ are not particularly limited so long as they correspond to the above definition. Specifically, substituents mentioned for substituent $R^1$ may, for example, be mentioned.

The triarylamine polymer of the present invention is not particularly limited so long as it corresponds to the above definition, but those of the following formulae (14) to (18) are particularly preferred:

definition. However, specifically, substituents mentioned for substituent $R^1$ may, for example, be mentioned. They are preferably any one of a hydrogen atom and $C_{1-8}$ alkyl, alkoxy and alkenyl groups.

The weight-average molecular weight of the triarylamine polymer of the present invention is not particularly limited so long as it is one referred to as a triarylamine polymer. However, it is preferably within a range of from 500 to 500,000, as

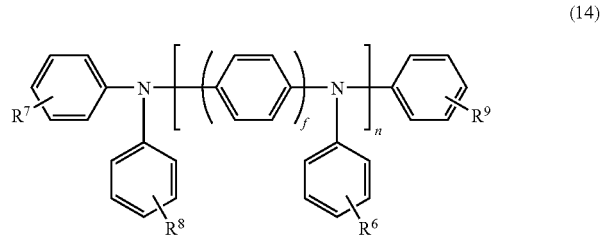

(14)

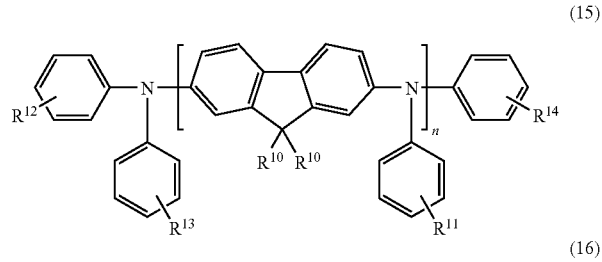

(15)

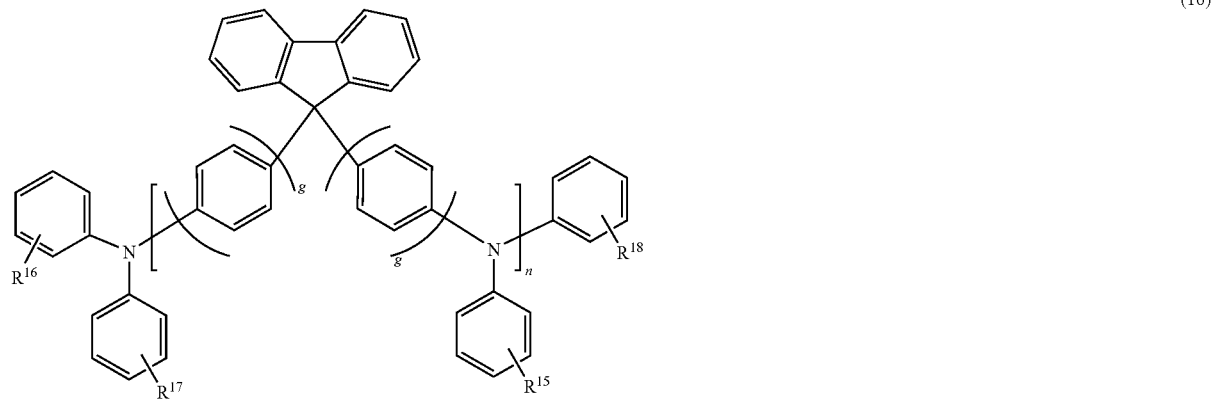

(16)

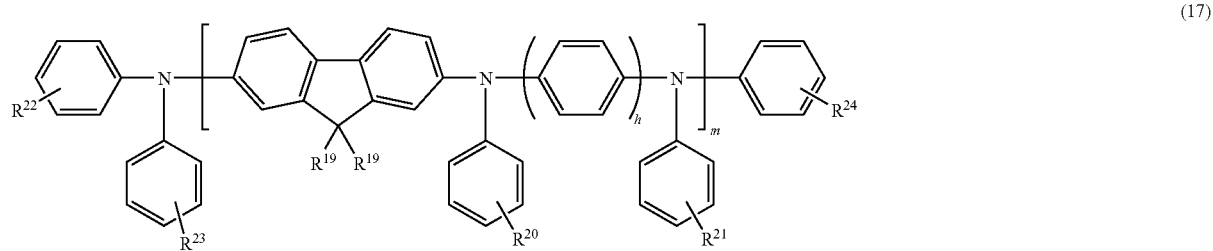

(17)

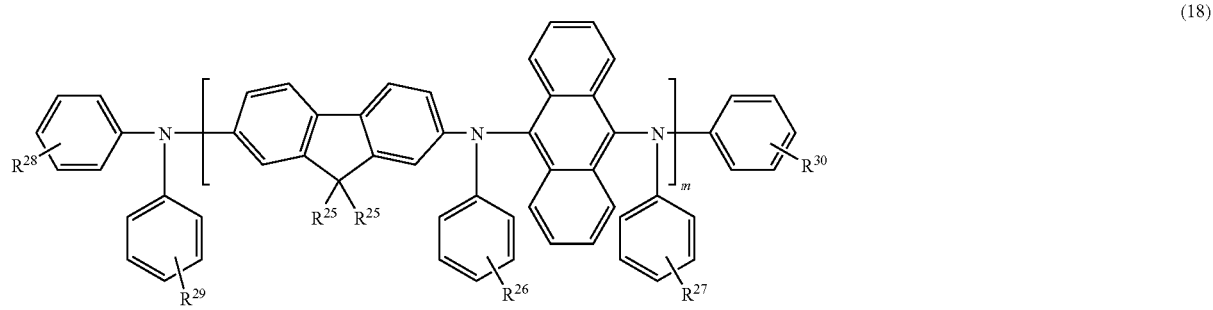

(18)

(wherein each of $R^6$ to $R^{30}$ which are independent of one another, is a hydrogen atom, a halogen atom, an alkyl group, an alkoxy group, an alkenyl group, an aryl group, an arylamino group or a heteroaryl group, each of f, g and h is an integer of from 1 to 4, m is an integer of at least 1, and n is an integer of at least 2.)

In the above formulae (14) to (18), $R^6$ to $R^{30}$ are not particularly limited so long as they correspond to the above calculated as polystyrene, more preferably within a range of from 1,000 to 100,000, as calculated as polystyrene.

BEST MODE FOR CARRYING OUT THE INVENTION

Figure 1:
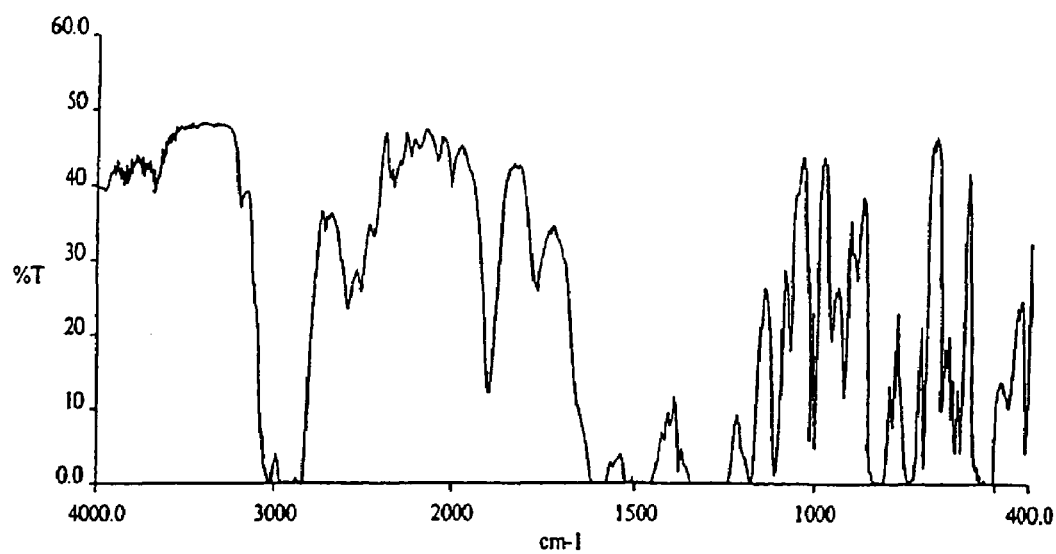
FIG. 1 shows the results of measurement by an infrared spectroscopic analysis of the triarylamine polymer represented by the formula (23).

Now, the process for producing a triarylamine polymer of the present invention will be described.

The triarylamine polymer represented by the above formula (1) or (2) of the present invention can be simply and efficiently produced by reacting a triarylamine polymer having repeating structural units represented by the following formula (19) or (20):

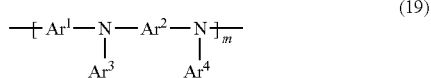
(19)

(20)

(wherein each of $Ar^1$, $Ar^2$, $Ar^3$ and $Ar^4$ which are independent of one another, is an unsubstituted or substituted $C_{6-60}$ aromatic group, m is an integer of at least 1, and n is an integer of at least 2) with an arylamine represented by the following formula (21):

(21)

(wherein each of $Ar^5$ and $Ar^6$ which are independent of each other, is an unsubstituted or substituted $C_{6-60}$ aromatic group) and/or an aryl halide represented by the following formula (22):

X—$Ar^7$ (22)

(wherein $Ar^7$ each independently is an unsubstituted or substituted $C_{6-60}$ aromatic group, and X is a halogen atom) in the presence of a base and a catalyst comprising a trialkylphosphine and/or an arylphosphine and a palladium compound.

In the present invention, the methods for producing the triarylamine polymers represented by the above formulae (19) and (20) are not particularly limited. For example, they may be prepared by polymerizing various arylene dihalides with an arylamine or an arylenediamine in the presence of a base and a catalyst comprising a trialkylphosphine and/or an arylphosphine and a palladium compound.

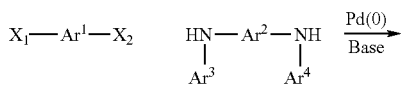

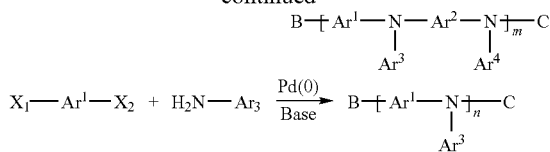

(in the reaction formulae, each of $Ar^1$, $Ar^2$, $Ar^3$ and $Ar^4$, which are independent of one another, is a $C_{6-60}$ aromatic group, each of $X^1$ and $x^2$ is a halogen atom, polymer terminals B and C represent a hydrogen atom or a halogen atom, m is an integer of at least 1, and n is an integer of at least 2.)

The arylamine shown in the above formula is not particularly limited. Specifically, however, it may, for example, be aniline, 2-fluoroaniline, 3-fluoroaniline, 4-fluoroaniline, o-toluidine, m-toluidine, p-toluidine, 2-ethylaniline, 3-ethylaniline, 4-ethylaniline, 4-propyl-aniline, 4-n-butylaniline, 4-t-butylaniline, o-anisidine, m-anisidine, p-anisidine, o-phenetidine, m-phenetidine, p-phenetidine, 1-aminonaphthalene, 2-aminonaphthalene, 1-aminoanthracene, 2-aminoanthracene, 9-aminophenanthrene, 2-aminobiphenyl or 4-aminobiphenyl.

The arylenediamine shown in the above formula, is not particularly limited. Specifically, however, it may, for example, be N,N'-diphenylphenylenediamine, N,N'-di(2-methoxyphenyl)phenylenediamine, N,N'-di(3-methoxyphenyl)phenylenediamine, N,N'-di(4-methoxyphenyl)phenylenediamine, N,N'-di(2-methylphenyl)phenylenediamine, N,N'-di(3-methylphenyl)phenylenediamine, N,N'-di(4-methylphenyl)phenylenediamine, N,N'-di(2-hydroxyphenyl)phenylenediamine, N,N'-di(3-hydroxyphenyl)phenylenediamine, N,N'-di(4-hydroxyphenyl)phenylenediamine, N,N'-di(2-trifluoromethylphenyl)phenylenediamine, N,N'-di(3-trifluoromethylphenyl)phenylenediamine, N,N'-di(4-trifluoromethylphenyl)phenylenediamine, N,N'-di(2,6-dimethylphenyl)phenylenediamine, N,N'-di(3,6-dimethylphenyl)phenylenediamine, N,N'-di(2,3-dimethylphenyl)phenylenediamine, N,N'-di(3,4-dimethylphenyl)phenylenediamine, N,N'-di(2,4-dimethylphenyl)phenylenediamine, N,N'-di(3,5-dimethylphenyl)phenylenediamine, N,N'-di(3-trifluoromethoxyphenyl)phenylenediamine, N,N'-di(4-trifluoromethoxyphenyl)phenylenediamine, N,N'-di(3-biphenyl)phenylenediamine, N,N'-di(4-biphenyl)phenylenediamine, N,N'-di(1-naphthyl)phenylenediamine, N,N'-di(2-naphthyl)phenylenediamine, N,N'-di(3,4-methylenedioxyphenyl)phenylenediamine, N,N'-di(2-methylnaphthyl)phenylenediamine, N,N'-di(4-methylnaphthyl)phenylenediamine, N,N'-di(2-fluorenyl)phenylenediamine, N,N'-diphenylbenzidine, N,N'-di(2-methoxyphenyl)benzidine, N,N'-di(3-methoxyphenyl)benzidine, N,N'-di(4-methoxyphenyl)benzidine, N,N'-di(2-methylphenyl)benzidine, N,N'-di(3-methylphenyl)benzidine, N,N'-di(4-methylphenyl)benzidine, N,N'-di(2-hydroxyphenyl)benzidine, N,N'-di(3-hydroxyphenyl)benzidine, N,N'-di(4-hydroxyphenyl)benzidine, N,N'-di(2-trifluoromethylphenyl)benzidine, N,N'-di(3-trifluoromethylphenyl)benzidine, N,N'-di(4-trifluoromethylphenyl)benzidine, N,N'-di(2,6-dimethylphenyl)benzidine, N,N'-di(3,6-dimethylphenyl)benzidine, N,N'-di(2,3-dimethylphenyl)benzidine, N,N'-di(3,4-dimethylphenyl)benzidine, N,N'-di(2,4-dimethylphenyl)benzidine, N,N'-di(3,5-dimethylphenyl)benzidine, N,N'-di(3-trifluoromethoxyphenyl)benzidine, N,N'-di(4-trifluoromethoxyphenyl)benzidine, N,N'-di(3-biphenyl)benzidine, N,N'-di(4-biphenyl)benzidine, N,N'-di(1-naphthyl)benzidine, N,N'-di(2-naphthyl)benzidine, N,N'-di(3,4-methylenedioxyphenyl)benzidine, N,N'-di(2-methylnaphthyl)benzidine, N,N'-di(4-methylnaphthyl)benzidine, N,N'-di(2-fluorenyl)benzidine or N,N'-diphenyl-9,10-anthracenediamine.

In the arylenediamine in the above reaction formula, when an arylenediamine having an asymmetrical structure is employed for the reaction with an arylene dihalide, repeating units may not regularly be arranged.

The arylene dihalide shown in the above reaction formulae, is not particularly limited. Specifically, however, it may, for example, be an unsubstituted or substituted dibromoaryl (such as 1,4-dibromobenzene, 1,2-dibromobenzene, 1,3-dibromobenzene, 2,5-dibromotoluene, 3,5-dibromotoluene, 1,4-dibromo-2,5-dimethylbenzene, 1,3-dibromo-5-(trifluoromethoxy)benzene, 4,4'-dibromobiphenyl, 9,10-dibromoanthracene, N-methyl-3,6-dibromocarbazole, N-ethyl-3,6-dibromocarbazole, N-propyl-3,6-dibromocarbazole, N-butyl-3,6-dibromocarbazole, 2,7-dibromo-fluorene, 2,7-dibromo-9,9-dimethyl-fluorene, 2,7-dibromo-9,9-diethyl-fluorene, 2,7-dibromo-9,9-diisopropyl-fluorene, 2,7-dibromo-9,9-di-n-butyl-fluorene, 2,7-dibromo-9,9-di-t-butyl-fluorene, 2,7-dibromo-9,9-di-sec-butyl-fluorene, 2,7-dibromo-9,9-di-n-hexyl-fluorene or 2,7-dibromo-9,9-di-n-octylfluorene); an unsubstituted or substituted dichloroaryl (such as 1,4-dichlorobenzene, 1,2-dichlorobenzene, 1,3-dichlorobenzene, 2,5-dichlorotoluene, 3,5-dichlorotoluene, 1,4-dichloro-2,5-dimethylbenzene, 1,3-dichloro-5-(trifluoromethoxy)benzene, 4,4'-dichloro-biphenyl, 9,10-dichloroanthracene, N-methyl-3,6-dichlorocarbazole, N-ethyl-3,6-dichlorocarbazole, N-propyl-3,6-dichlorocarbazole, N-butyl-3,6-dichlorocarbazole, 2,7-dichlorofluorene, 2,7-dichloro-9,9-dimethyl-fluorene, 2,7-dichloro-9,9-diethylfluorene, 2,7-dichloro-9,9-diisopropyl-fluorene, 2,7-dichloro-9,9-di-n-butyl-fluorene, 2,7-dichloro-9,9-di-t-butyl-fluorene, 2,7-dichloro-9,9-di-sec-butyl-fluorene, 2,7-dichloro-9,9-di-n-hexyl-fluorene or 2,7-dichloro-9,9-di-n-octyl-fluorene); an unsubstituted or substituted diiodoaryl (such as 1,4-diiodobenzene, 1,2-diiodobenzene, 1,3-diiodobenzene, 2,5-diiodotoluene, 3,5-diiodotoluene, 1,4-diiodo-2,5-dimethylbenzene, 1,3-diiodo-5-(trifluoromethoxy)benzene, 4,4'-diiodobiphenyl, 9,10-diiodoanthracene, N-methyl-3,6-diiodocarbazole, N-ethyl-3,6-diiodocarbazole, N-propyl-3,6-diiodocarbazole, N-butyl-3,6-diiodocarbazole, 2,7-diiodofluorene, 2,7-diiodo-9,9-dimethyl-fluorene, 2,7-diiodo-9,9-diethyl-fluorene, 2,7-diiodo-9,9-diisopropyl-fluorene, 2,7-diiodo-9,9-di-n-butyl-fluorene, 2,7-diiodo-9,9-di-t-butyl-fluorene, 2,7-diiodo-9,9-di-sec-butyl-fluorene, 2,7-diiodo-9,9-di-n-hexyl-fluorene or 2,7-diiodo-9,9-di-n-octyl-fluorene).

The palladium compound to be used as a catalyst component is not particularly limited. For example, it may be a tetravalent palladium compound (such as sodium hexachloropalladate(IV) tetrahydrate or potassium hexachloropalladate(IV))), a bivalent palladium compound (such as palladium(II) chloride, palladium(II) bromide, palladium(II) acetate, palladium(II) acetylacetonate, palladium(II) dichlorobis(benzonitrile), palladium(II) dichlorobis(acetonitrile), palladium(II) dichlorobis(triphenylphosphine), palladium (II) dichlorotetraamine, palladium(II) dichloro(cycloocta-1,5-diene) or palladium(II) trifluoroacetate), or a zerovalent palladium compound (such as dipalladium(0) tris(dibenzylidene acetone), dipalladium tris(dibenzylidene acetone)/chloroform complex (0) or palladium(0) tetrakis(triphenylphosphine)).

The amount of the palladium compound is not particularly limited, but for example, it is usually within a range of from 0.00001 to 20 mol %, as calculated as palladium, per mol of the halogen atoms of the arylene dihalide as the starting material. Since an expensive palladium compound is used, it is usually preferably within a range of from 0.001 top 5 mol %, as calculated as palladium, per mol of the halogen atoms of the arylene dihalide as the starting material.

The trialkylphosphine to be used as a catalyst component in the process of the present invention, is not particularly limited. For example, it may be triethylphosphine, tricyclohexylphosphine, triisopropylphosphine, tri-n-butylphosphine, tri-isobutylphosphine, tri-sec-butylphosphine or tri-tert-butylphosphine. Among them, it is particularly preferred to use tert-butylphosphine, since it has a particularly high reaction activity as a catalyst among them.

Further, in the process of the present invention, the arylphosphine to be used as a catalyst component is not particularly limited. For example, it may be triphenylphosphine, tri(o-tolyl)phosphine, tri(m-tolyl)phosphine, tri(p-tolyl)phosphine, 2,2'-bis(diphenylphosphino)-1,1'-binaphthyl(BI-NAP), trimethylphosphine, diphenylphosphinoethane, diphenylphosphinopropane or diphenylphoshpinoferrocene.

The amount of the trialkylphosphine and/or the arylphosphine is not particularly limited. However, it may be used usually within a range of from 0.01 to 10,000 mols per mol of the palladium compound. Since an expensive trialkylphosphine and/or arylphosphine is used, it is preferably within a range of from 0.1 to 10 mols per mol of the palladium compound.

The method for adding the catalysts is not particularly limited. They may simply be added as the respective catalyst components to the reaction systems, or they may be preliminarily formed into complexes comprising the respective catalyst components and then added.

The base is not particularly limited. For example, it may be an inorganic base such as a carbonate of sodium or potassium or an alkali metal alkoxide, or an organic base such as a tertiary amine. Among them, preferred is an alkali metal alkoxide such as sodium methoxide, sodium ethoxide, potassium methoxide, potassium ethoxide, lithium tert-butoxide, sodium tert-butoxide or potassium tert-butoxide. Such a base may be added as it is to the reaction system. Otherwise, it may be prepared from an alkali metal, an alkali metal hydride or an alkali metal hydroxide, and an alcohol at the site and then added to the reaction system. More preferably, a tertiary alkoxide such as lithium tert-butoxide, sodium tert-butoxide or potassium tert-butoxide, is added, as it is, to the reaction system.

The amount of the base is not particularly limited, but is preferably at least 0.5 mol per mol of the halogen atoms of the aryl halide to be added to the reaction system. Taking into consideration the post treatment operation after completion of the reaction, it is particularly preferably within a range of from 1 to 5 mols per mol of the halogen atoms of the aryl halide.

The polymer thus obtained may vary depending upon the conditions such as the starting materials, their charged ratio, etc. However, halogen or secondary amine terminal moieties derived from the starting materials shown in the above reaction formulae will be mainly present. In a case where such a polymer is to be used as a hole injecting material for e.g. an organic EL element, there will be a problem of the remaining halogen or thermal instability, whereby from the viewpoint of the useful life, it is not suitable for use for a long period of time. Therefore, an arylamine represented by the formula (21) and/or an aryl halide represented by the formula (22) is further reacted to prepare a polymer having improved stability.

The arylamine represented by the formula (21) to be used in the process of the present invention, is not particularly limited. Specifically, however, it may, for example, be diphenylamine, di-p-tolylamine, N-phenyl-1-naphthylamine or N-phenyl-2-naphthylamine.

The aryl halide represented by the above formula (22) to be used in the process of the present invention, is not particularly limited. Specifically, however, it may, for example, be an unsubstituted or substituted bromobenzene (such as bromobenzene, 2-bromotoluene, 3-bromotoluene, 4-bromotoluene, 2-bromo-m-xylene, 2-bromo-p-xylene, 3-bromo-o-xylene, 4-bromo-o-xylene, 4-bromo-m-xylene, 5-bromo-m-xylene, 1-bromo-2-ethylbenzene, 1-bromo-4-ethylbenzene, 1-bromo-4-propylbenzene, 1-bromo-4-n-butylbenzene, 1-bromo-4-t-butylbenzene, 1-bromo-5-(trifluoromethoxy) benzene, 2-bromoanisole, 3-bromoanisole, 4-bromoanisole, 1-bromonaphthalene, 2-bromonaphthalene, 2-bromobiphenyl, 3-bromobiphenyl, 4-bromobiphenyl, 9-bromoanthracene, 9-bromophenanthrene, N-methyl-3-bromocarbazole, N-ethyl-3-bromocarbazole, N-propyl-3-bromocarbazole, N-butyl-3-bromocarbazole, 2-bromofluorene, 2-bromo-9,9-dimethyl-fluorene, 2-bromo-9,9-diethyl-fluorene, 2-bromo-9,9-diisopropyl-fluorene, 2-bromo-9,9-di-n-butyl-fluorene, 2-bromo-9,9-di-t-butyl-fluorene, 2-bromo-9,9-di-sec-butyl-fluorene, 2-bromo-9,9-di-n-hexyl-fluorene or 2-bromo-9,9-di-n-octyl-fluorene), an unsubstituted or substituted chlorobenzene (such as chlorobenzene, 2-chlorotoluene, 3-chlorotoluene, 4-chlorotoluene, 2-chloro-m-xylene, 2-chloro-p-xylene, 3-chloro-o-xylene, 4-chloro-o-xylene, 4-chloro-m-xylene, 5-chloro-m-xylene, 1-chloro-2-ethylbenzene, 1-chloro-4-ethylbenzene, 1-chloro-4-propyl-benzene, 1-chloro-4-n-butylbenzene, 1-chloro-4-t-butylbenzene, 1-chloro-5-(trifluoromethoxy) benzene, 2-chloroanisole, 3-chloroanisole, 4-chloroanisole, 1-chloronaphthalene, 2-chloronaphthalene, 2-chlorobiphenyl, 3-chlorobiphenyl, 4-chlorobiphenyl, 9-chloroanthracene, 9-chlorophenanthrene, N-methyl-3-chlorocarbazole, N-ethyl-3-chlorocarbazole, N-propyl-3-chlorocarbazole, N-butyl-3-chlorocarbazole, 2-chlorofluorene, 2-chloro-9,9-dimethyl-fluorene, 2-chloro-9,9-diethyl-fluorene, 2-chloro-9,9-diisopropyl-fluorene, 2-chloro-9,9-di-n-butyl-fluorene, 2-chloro-9,9-di-t-butylfluorene, 2-chloro-9,9-di-sec-butylfluorene, 2-chloro-9,9-di-n-hexyl-fluorene or 2-chloro-9,9-di-n-octylfluorene), or an unsubstituted or substituted iodobenzene (such as iodobenzene, 2-iodotoluene, 3-iodotoluene, 4-iodotoluene, 2-iodo-m-xylene, 2-iodo-p-xylene, 3-iodo-o-xylene, 4-iodo-o-xylene, 4-iodo-m-xylene, 5-iodo-m-xylene, 1-iodo-2-ethylbenzene, 1-iodo-4-ethylbenzene, 1-iodo-4-propylbenzene, 1-iodo-4-n-butylbenzene, 1-iodo-4-t-butylbenzene, 1-iodo-5-(trifluoromethoxy)benzene, 2-iodoanisole, 3-iodoanisole, 4-iodoanisole, 1-iodonaphthalene, 2-iodonaphthalene, 2-iodobiphenyl, 3-iodobiphenyl, 4-iodobiphenyl, 9-iodoanthracene, 9-iodophenanthrene, N-methyl-3-iodocarbazole, N-ethyl-3-iodocarbazole, N-propyl-3-iodocarbazole, N-butyl-3-iodocarbazole, 2-iodofluorene, 2-iodo-9,9-dimethyl-fluorene, 2-iodo-9,9-diethyl-fluorene, 2-iodo-9,9-diisopropyl-fluorene, 2-iodo-9,9-di-n-butyl-fluorene, 2-iodo-9,9-di-t-butyl-fluorene, 2-iodo-9,9-di-sec-butyl-fluorene, 2-iodo-9,9-di-n-hexyl-fluorene or 2-iodo-9,9-di-n-octyl-fluorene).

In the process of the present invention, the arylamine represented by the above formula (21) and/or the aryl halide represented by the formula (22) may be added and reacted after preparing the triarylamine polymer represented by the above formula (19) or (20), or may be directly added into the reactor and reacted during the process for preparing the triarylamine polymer. Preferably, during the preparation of the triarylamine polymer, it is added into the reactor after a certain time and sequentially added for reaction.

In the process of the present invention, the amount of the arylamine represented by the above formula (21) and/or the arylamine halide represented by the formula (22) may vary depending upon the molecular weight of the triarylamine polymer to be used for the reaction or the polymerization reaction conditions and is not particularly limited. However, in the case where it is directly added during the polymerization reaction, it is preferably added in a proportion of from 0.01 to 0.8 mol, more preferably from 0.1 to 0.5 mol, per mol of the arylene dihalide as the starting material:

In the reaction of the arylamine represented by the above formula (21) and/or the aryl halide represented by the formula (22) with the triarylamine polymer represented by the above formula (19) or (20) of the present invention, the reaction is proceeded in the presence of the same base and catalyst comprising a trialkylphosphine and/or an arylphosphine and palladium compound, as used for the polymerization of the triarylamine polymer represented by the above formula (19) or (20).

In the process of the present invention, the amounts of the base and the palladium compound, the trialkylphosphine and/or the arylphosphine to be used as the catalyst, vary depending upon the molecular weight of the triarylamine polymer to be used for the reaction and accordingly are not limited. However, for example, in a case where the arylamine and/or the aryl halide is directly added during the polymerization reaction, it is unnecessary to add the palladium compound, whereby the process can be simplified.

The production of the triarylamine polymer of the present invention is usually preferably carried out in the presence of an inert solvent. The solvent to be used is not particularly limited so long as it is a solvent which does not substantially hinder the present invention. For example, an aromatic hydrocarbon solvent such as benzene, toluene or xylene, an ether solvent such as diethyl ether, tetrahydrofuran or dioxane, acetonitrile, dimethylformamide, dimethylsulfoxide or hexamethylphosphotriamide, may, for example, be mentioned. Among them, preferred is an aromatic hydrocarbon solvent such as benzene, toluene or xylene.

The production of the triarylamine of the present invention is preferably carried out under an atmospheric pressure in an atmosphere of an inert gas such as nitrogen or argon, but may be carried out under an elevated pressure condition.

In the process of the present invention, the reaction temperature is not particularly limited so long as it is a reaction temperature at which the triarylamine can be produced. However, it is usually within a range of from 20 to 300° C., preferably from 50 to 200° C., more preferably from 100 to 150° C.

In the process of the present invention, the reaction time varies depending upon the triarylamine polymer to be produced and is not particularly limited. However, in many cases, it may be selected within a range of from a few minutes to 72 hours, preferably less than 24 hours.

The triarylamine polymer of the present invention may be used as an electroconductive polymer material in an electron element such as a field effect transistor, a photonic device, a dye-sensitized solar cell or an organic electroluminescence element. Particularly, it is very useful as a hole transport material, a light emitting material or a buffer material for an organic electroluminescence element.

The organic EL element of the present invention is not particularly limited with respect to the structure of the element, so long as it is provided with an organic layer containing the above polymer material. The triarylamine polymer of the present invention is excellent in solubility. Accordingly, by using a solution, a mixed liquid or a molten liquid of such a material, the above element can simply be prepared by a conventional coating method such as a spin coating method, a casting method, a dipping method, a bar coating method or a roll coating method. Further, it can easily be prepared also by an inkjet method, a Langmuir-Blodgett method or the like.

EXMAPLES

Now, Examples of the present invention will be described, but the present invention is by no means restricted to such Examples.

Example 1

Into a 100 ml four-necked round bottom flask equipped with a condenser and a thermometer, 4.06 g (10 mmol) of 4,4'-diiodobiphenyl, 1.64 g (11 mmol) of 4-n-butylaniline, 2.31 g (24 mmol; 1.2 equivalent to bromine atoms) of sodium tert-butoxide and 40 ml of o-xylene were charged at room temperature. To this mixed liquid, an o-xylene (5 ml) solution of 22.9 mg (0.025 mmol; 0.25 mol % to bromine atoms) of dipalladium tris(dibenzylideneacetone)/chloroform complex and 0.22 ml (4 equivalent to palladium atoms) of tri-tert-butyl phosphine, preliminarily prepared in a nitrogen atmosphere, was added. Thereafter, in a nitrogen atmosphere, the temperature was raised to 120° C., followed by aging for three hours while heating and stirring at 120° C. After three hours, 0.32 g (2 mmol) of bromobenzene was added, and the reaction was carried out for further three hours. After completion of the reaction, this reaction mixture was cooled to about 80° C. and then slowly added to a stirred solution of a 90% acetone aqueous solution (200 ml). A solid was recovered by filtration, then washed sequentially with acetone, water and acetone, followed by drying under reduced pressure to obtain a slightly yellow powder (96%).

The obtained powder was measured by an elemental analysis and an infrared spectroscopic analysis, whereby it was confirmed to be a triarylamine polymer represented by the following formula (23). The results of measurement by the elemental analysis and the infrared spectroscopic analysis are shown in Table 1 and FIG. 1, respectively. Further, the obtained polymer was analyzed by THF type GPC (HLC-8220, manufactured by Tosoh Corporation; column: G4000H$_{xL}$-G3000H$_{xL}$-G2000H$_{xL}$-G2000H$_{xL}$ (all manufactured by Tosoh Corporation)), whereby as calculated as polystyrene, the weight-average molecular weight was 9,700, and the number-average molecular weight was 5,800 (polydispersity index (PDI): 1.7). The glass transition temperature was 171° C.

(23)

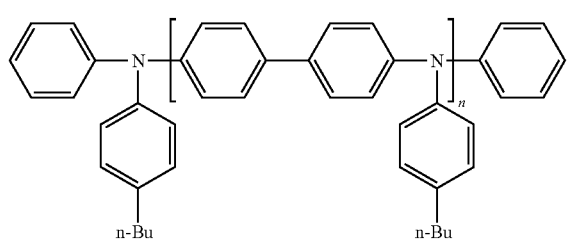

TABLE 1

| | C | H | N |
|---|---|---|---|
| Measured value (wt %) | 87.9 | 6.9 | 4.2 |
| Theoretical value (wt %) | 88.2 | 7.1 | 4.7 |

Comparative Example 1

Figure 2:
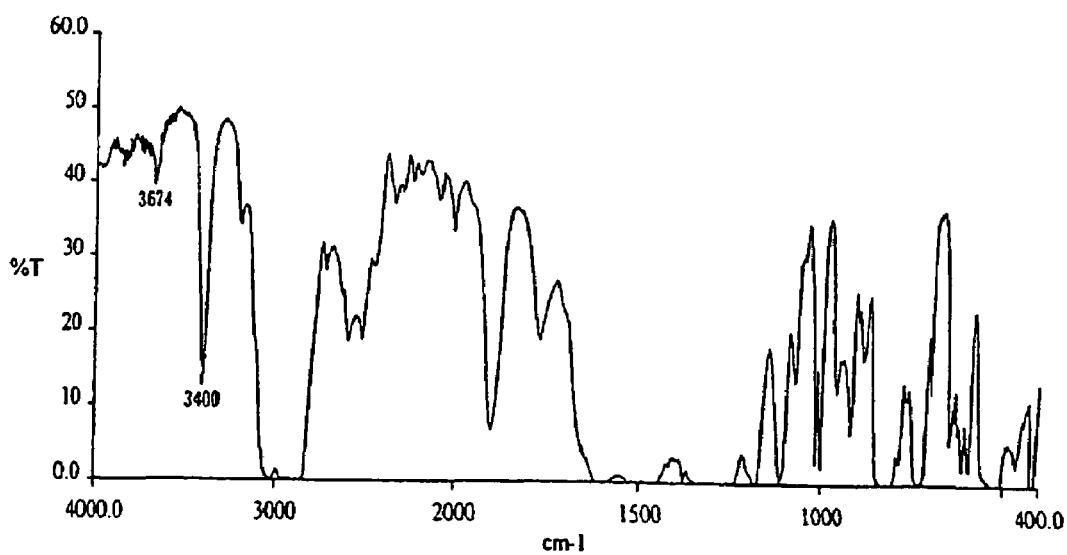
FIG. 2 shows the results of measurement by an infrared spectroscopic analysis of the triarylamine polymer represented by the formula (24).

Into a 100 ml four-necked round bottom flask equipped with a condenser and a thermometer, 4.06 g (10 mmol) of 4,4'-diiodobiphenyl, 1.64 g (11 mmol) of 4-n-butylaniline, 2.31 g (24 mmol; 1.2 equivalent to bromine atoms) of sodium tert-butoxide and 40 ml of o-xylene were charged at room temperature. To this mixed liquid, an o-xylene (5 ml) solution of 22.9 mg (0.025 mmol; 0.25 mol % to bromine atoms) of dipalladium tris(dibenzylideneacetone)/chloroform complex and 0.22 ml (4 equivalent to palladium atoms) of tri-tert-butyl phosphine, preliminarily prepared in a nitrogen atmosphere, was added. Thereafter, in a nitrogen atmosphere, the temperature was raised to 120° C., followed by aging for three hours while heating and stirring at 120° C. After completion of the reaction, this reaction mixture was cooled to about 80° C. and gradually added to a stirred solution of a 90% acetone aqueous solution (200 ml). A solid was recovered by filtration, then washed sequentially with acetone, water and acetone, followed by drying under reduced pressure to obtain a slightly yellow powder (96%). The obtained powder was measured by an elemental analysis and an infrared spectroscopic analysis, whereby it was confirmed to be the triarylamine polymer represented by the following formula (24). The results of measurement by the elemental analysis and the infrared spectroscopic analysis are shown in Table 2 and FIG. 2, respectively. Further, the obtained polymer was analyzed by THF type GPC (HLC-8220, manufactured by Tosoh Corporation), whereby as calculated as polystyrene, the weight-average molecular weight was 9,800, and the number-average molecular weight was 5,800 (PDI: 1.7). The glass transition temperature was 166° C.

(21)

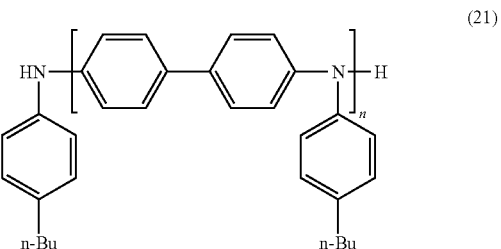

TABLE 2

| | C | H | N |
|---|---|---|---|
| Measured value (wt %) | 87.7 | 7.1 | 4.7 |
| Theoretical value (wt %) | 88.2 | 7.1 | 4.7 |

Example 2

Figure 3:
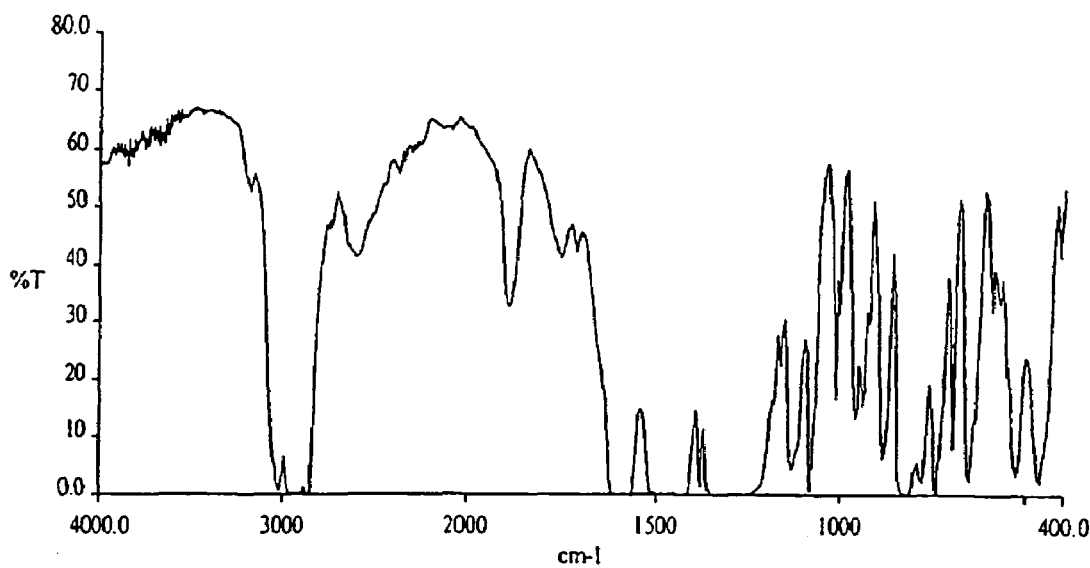
FIG. 3 shows the results of measurement by an infrared spectroscopic analysis of the triarylamine polymer represented by the formula (25).

A yellow powder was obtained by carrying out the operation in accordance with the method disclosed in Example 1 except that in Example 1, instead of 4.06 g (10 mmol) of 4,4'-diiodobiphenyl, 3.52 g (10 mmol) of 2,7-dibromo-9,9'-dimethylfluorene was used. The obtained powder was measured by an infrared spectroscopic analysis, whereby it was confirmed to be a triarylamine polymer represented by the following formula (25). The results of measurement of the infrared spectroscopic analysis are shown in FIG. 3. Further, the obtained polymer was analyzed by THF type GPC (HLC-8220, manufactured by Tosoh Corporation), whereby as calculated as polystyrene, the weight-average molecular weight was 9,800, and the number-average molecular weight was 6,000 (PDI: 1.6). The glass transition temperature was 188° C.

(25)

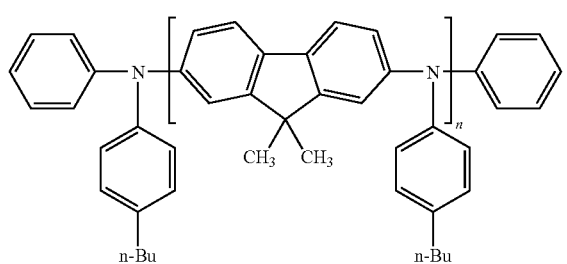

Comparative Example 2

Figure 4:
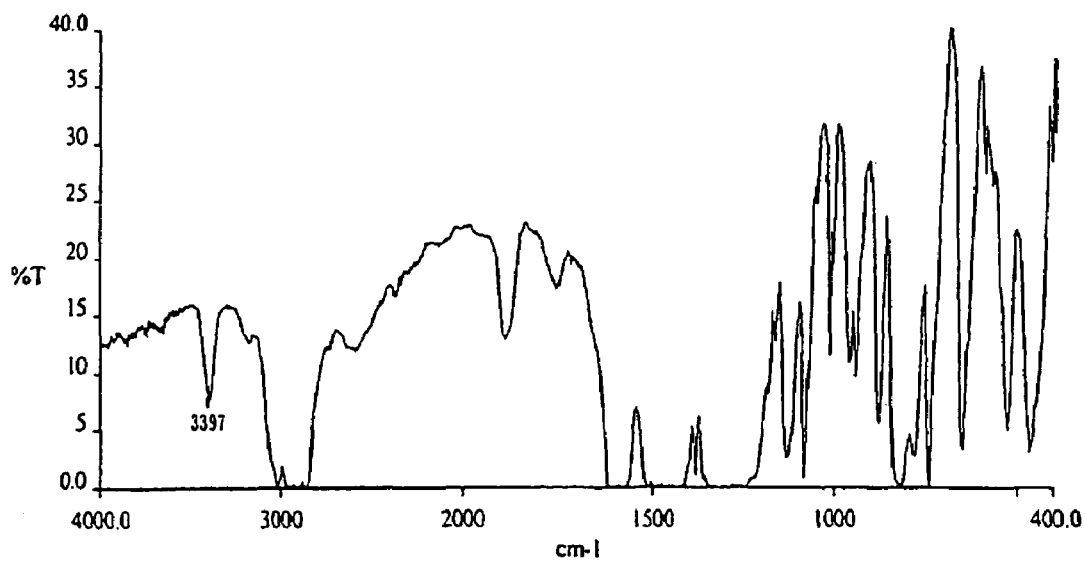
FIG. 4 shows the results of measurement by an infrared spectroscopic analysis of the triarylamine polymer represented by the formula (26).

A yellow powder was obtained by carrying out the operation in accordance with the method disclosed in Comparative Example 1 except that in Comparative Example 1, instead of 4.06 g (10 mmol) of 4,4'-diiodobiphenyl, 3.52 g (10 mmol) of 2,7-dibromo-9,9'-dimethylfluorene was used. The obtained powder was measured by an elemental analysis and an infrared spectroscopic analysis, whereby it was confirmed to be a triarylamine polymer represented by the following formula (26). The results of measurement of the infrared spectroscopic analysis are shown in FIG. 4. Further, the obtained polymer was analyzed by THF type GPC (HLC-8220, manufactured by Tosoh Corporation), whereby as calculated as polystyrene, the weight-average molecular weight was 10,200, and the number-average molecular weight was 6,200 (PDI: 1.6). The glass transition temperature was 179° C.

(26)

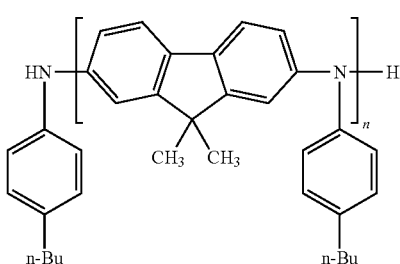

Example 3

A reaction was carried out for three hours with stirring under heating at 120° C. in accordance with the specification disclosed in Comparative Example 1 except that in Comparative Example 1, the charged amount of 4-n-butylaniline was changed from 1.64 g (11 mmol) to 1.49 g (10 mmol). Three hours later, 47 mg (0.3 mmol) of bromobenzene was added, followed by stirring for further two hours. Then, 85 mg (0.5 mmol) of diphenylamine was added, followed by stirring for further two hours. After completion of the reaction, this reaction mixture was cooled to about 80° C., and then slowly added to a stirred solution of a 90% acetone aqueous solution (200 ml). A solid was recovered by filtration, washed sequentially with acetone, water and acetone and then dried under reduced pressure to obtain a slightly yellow powder (96%). The infrared spectroscopic analysis of the obtained powder was the same as the result obtained in Example 1. Further, the obtained polymer was analyzed by THF type GPC (HLC-8220, manufactured by Tosoh Corporation), whereby as calculated as polystyrene, the weight-average molecular weight was 65,100, and the number-average molecular weight was 20,200 (PDI: 3.2).

Example 4

A yellow powder was obtained by carrying out the operation in accordance with the method disclosed in Example 1 except that in Example 1, instead of 4.06 g (10 mmol) of 4,4'-diiodobiphenyl, 5.5 g (10 mmol) of 2,7-dibromo-9,9'-dioctylfluorene was used, and instead of 1.64 g (11 mmol) of 4-n-butylaniline, 1.02 g (11 mmol) of aniline was used. The obtained powder was measured by an infrared spectroscopic analysis, whereby it was confirmed to be a triarylamine polymer represented by the following formula (27). Further, the obtained polymer was analyzed by THF type GPC (HLC-8220, manufactured by Tosoh Corporation), whereby as calculated as polystyrene, the weight-average molecular weight was 9,800, and the number-average molecular weight was 6,000 (PDI: 1.6).

(27)

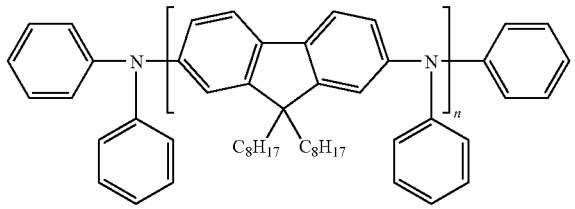

Example 5

A yellow powder was obtained by carrying out the operation in accordance with the method disclosed in Example 3 except that in Example 4, instead of 1.02 g (11 mmol) of aniline, 2.66 g (10 mmol) of N,N'-diphenylphenylenediamine was used. The obtained powder was measured by an infrared spectroscopic analysis, whereby it was confirmed to be a triarylamine polymer represented by the following formula (28). Further, the obtained polymer was analyzed by GPC (HLC-8220, manufactured by Tosoh Corporation), whereby as calculated as polystyrene, the weight-average molecular weight was 19,000, and the number-average molecular weight was 9,200 (PDI: 2.1).

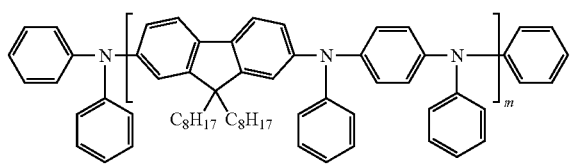

(28)

Example 6

A yellow powder was obtained by carrying out the operation in accordance with the method disclosed in Example 1 except that in Example 4, instead of 1.02 g (11 mmol) of aniline, 3.7 g (11 mmol) of N,N'-diphenylbenzidine was used. The obtained powder was measured by an infrared spectroscopic analysis, whereby it was confirmed to be a triarylamine polymer represented by the following formula (29). Further, the obtained polymer was analyzed by GPC (HLC-8220, manufactured by Tosoh Corporation), whereby as calculated as polystyrene, the weight-average molecular weight was 16,000, and the number-average molecular weight was 7,600 (PDI: 2.1).

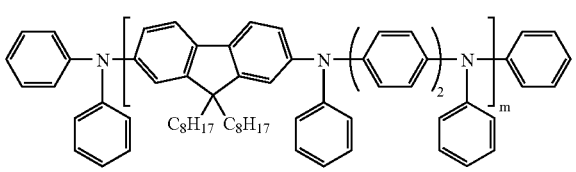

(29)

Example 7

An orange color powder was obtained by carrying out the operation in accordance with the method disclosed in Example 1 except that in Example 4, instead of 1.02 g (11 mmol) of aniline, 3.6 g (10 mmol) of N,N'-diphenyl-9,10-anthracenediamine was used. The obtained powder was measured by an infrared spectroscopic analysis, whereby it was confirmed to be a triarylamine polymer represented by the following formula (30). Further, the obtained polymer was analyzed by GPC (HLC-8220, manufactured by Tosoh Corporation), whereby as calculated as polystyrene, the weight-average molecular weight was 8,300, and the number-average molecular weight was 4,300 (PDI: 1.9).

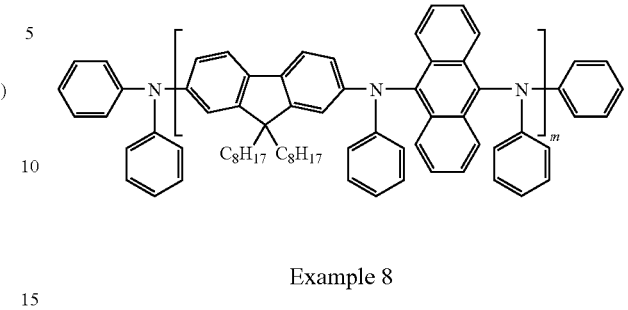

(30)

Example 8

Comparison of Heat Resistance

The triarylamine polymers (23) and (24) prepared in Example 1 and Comparative Example 1 were heated in an electric furnace at 230° C. in a nitrogen stream. With respect to the appearance of the polymers after the heating, the color change was more with the polymer (24). They were formed into 0.1% solutions, and APHA was compared between before heating and after heating by a color difference meter (ZE2000, manufactured by Nippon Denshoku K. K.), and the results are shown in Table 3.

TABLE 3

| | APHA | |
| --- | --- | --- |
| | Before heating | After heating |
| Polymer (23) | 230 | 260 |
| Polymer (24) | 235 | 320 |

Example 9

Preparation and Evaluation of an Element

Firstly, on an ITO glass substrate, a toluene solution of the polymer (23) prepared in Example 1, was spin-coated to form a film having a thickness of 350 Å. After drying for one hour at 60° C. under reduced pressure, 4,4,-bis[N-(1-naphthyl)-N-phenylamino]biphenyl (α-NPB, 500 Å), aluminum/8-quinolinol complex (Alq 3, 500 Å) lithium fluoride (5 Å) and aluminum (1,000 Å) were vapor deposited thereon in this order. The emission characteristics when a voltage was applied to the EL element prepared in such a manner, are shown in Table 4.

Comparative Example 3

Preparation and Evaluation of an Element

An element was prepared in the same manner as in Example 9 except that in Example 9, instead of the polymer (23), the polymer (24) prepared in Comparative Example 1 was used. The emission characteristics are shown in Table 4.

Comparative Example 4

Preparation and Evaluation of an Element

An element was prepared in the same manner as in Example 9 except that in Example 9, no film of the polymer

(23) was formed on the ITO glass substrate. The emission characteristics are shown in Table 4.

TABLE 4

|  | Turn-on voltage (V) | Luminous efficiency (lm/W) | Current efficiency (cd/A) |
|---|---|---|---|
| Ex. 9 (23) | 3 | 2.8 | 2.7 |
| Comp. Ex. 3 (24) | 3 | 2.2 | 2.1 |
| Comp. Ex. 4 | 3 | 0.02 | 0.02 |

From the foregoing results, it is evident that an EL device employing a polymer having the terminals subjected to cap treatment, can be driven at a lower voltage, and its heat resistance is improved. Accordingly, it is evident that a still larger superiority will be obtained when it is used for a long period of time.

INDUSTRIAL APPLICABILITY

The present invention provides a novel triarylamine polymer having repeating structural units wherein tertiary arylamino groups are continuously present to the terminals, an efficient process for its production and its use.

The novel triarylamine polymer of the present invention is not only excellent in solubility but also excellent in storage stability and heat resistance with minimum discoloration and thus has excellent film-forming properties and stability. With respect to its applications, it is not only useful as a hole transport material, a light emitting material or a buffer material for an organic EL element but also very useful as an electroconductive polymer to be used for an electron element such as a field effect transistor, a photonic device or a dye-sensitized solar cell. Thus, the present invention is industrially very significant.

The invention claimed is:

1. A triarylamine polymer represented by formula (1):

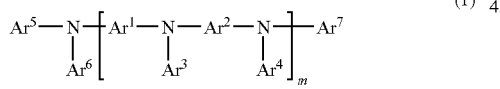

(1)

wherein $Ar^1$ and $Ar^2$, are different from each other and are, independent of each other, any one of the following formulas (4) to (8):

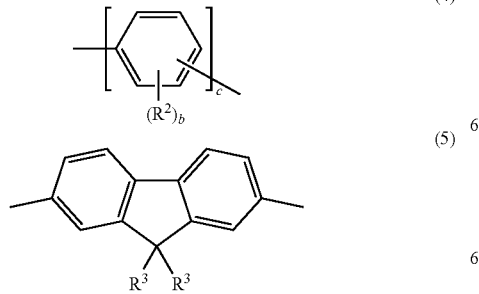

(4)

(5)

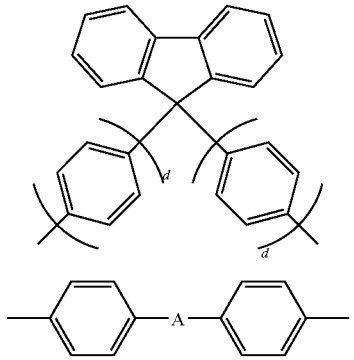

(6)

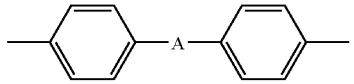

(7)

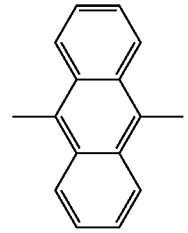

(8)

wherein $R^2$ and $R^3$ are, independent of each other, a hydrogen atom, a halogen atom, an alkyl group, an alkoxy group, an alkenyl group, an aryl group, an arylamino group or a heteroaryl group, $R^2$ may, together with one or more substituents, form a condensed ring, A is S, O, $SO_2$, CO, $CH_2$ or $(CH_3)_2$, b is an integer of from 0 to 4, c is an integer of from 2 to 4, and d is an integer of from 1 to 4, $Ar^3$, $Ar^4$, $Ar^5$, $Ar^6$ and $Ar^7$ are, independent of one another, an unsubstituted or substituted $C_{6-60}$ aromatic group, and $Ar^3$ and $Ar^4$ are the same, and m is an integer of at least 1, wherein the triarylamine polymer has a weight average molecular weight of from 16000 to 100,000 as calculated as polystyrene.

2. The triarylamine polymer according to claim 1, wherein $Ar^5$ and $Ar^7$ are the same, and $Ar^3$ and $Ar^6$ are the same.

3. The triarylamine polymer according to claim 1, wherein $Ar^5$, $Ar^6$ and $Ar^7$ are represented by the following formula (3):

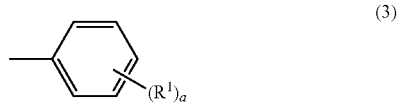

(3)

wherein $R^1$ each independently is a hydrogen atom, a halogen atom, an alkyl group, an alkoxy group, an alkenyl group, an aryl group, an arylamino group or a heteroaryl group, $R^1$ may form a condensed ring together with one or more other substituents, and a is an integer of from 0 to 5.

4. The triarylamine polymer according to claim 3, wherein formula (3) is a phenyl group.

5. The triarylamine polymer according to claim 1, wherein in the formula (1), $Ar^3$ and $Ar^4$ are any one of the following formulas (9) to (13):

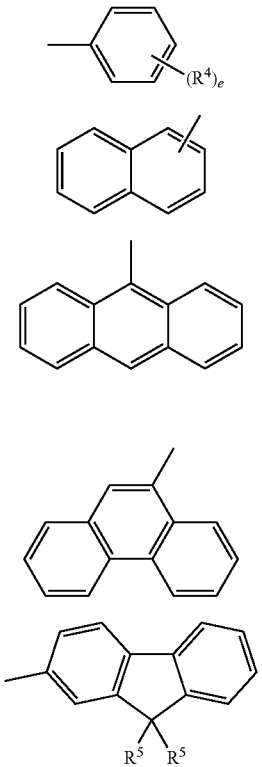

wherein $R^4$ and $R^5$ are, independent of each other, a hydrogen atom, a halogen atom, an alkyl group, an alkoxy group, an alkenyl group, an aryl group, an arylamino group or a heteroaryl group, $R^4$ may, together with one or more other substituents, form a condensed ring, and e is an integer of from 0 to 5.

6. A process for producing the triarylamine polymer as defined in claim 1, comprising:

reacting a triarylamine polymer having repeating structural units represented by the following formula (19):

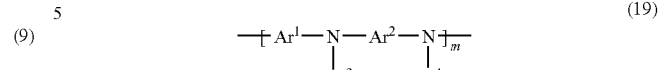 (19)

wherein $Ar^1$, $Ar^2$, $Ar^3$ and $Ar^4$ and m are the same as defined above; obtained by reacting an arylene dihalide with an arylenediamine in the presence of a base and a catalyst comprising a trialkylphosphine or an arylphosphine or both in combination and a palladium compound, with an arylamine represented by the following formula (21):

 (21)

wherein $Ar^5$ and $Ar^6$ are the same as defined above; and/or an aryl halide represented by the following formula (22):

X—$Ar^7$ (22)

wherein $Ar^7$ is the same as defined above, and X is a halogen atom in the presence of a base and a catalyst comprising a trialkylphosphine or an arylphosphine or both in combination and a palladium compound.

7. The process for producing the triarylamine polymer according to claim 6, wherein in the formula (19), the polymer terminals are hydrogen atoms or halogen atoms or both in combination.

8. The process for producing the triarylamine polymer according to claim 6, wherein the catalyst comprises tri-tert-butylphosphine.

9. An electron element comprising the triarylamine polymer as defined in claim 1.

10. The electron element according to claim 9, wherein said electron element is an organic electroluminescence element.

* * * * *